US 9,410,855 B2

(12) United States Patent
Ishiwatari et al.

(10) Patent No.: US 9,410,855 B2
(45) Date of Patent: Aug. 9, 2016

(54) METHOD FOR PRESS FORMING ANALYSIS

(75) Inventors: Akinobu Ishiwatari, Chiba (JP); Hirotaka Kano, Chiba (JP)

(73) Assignee: JFE STEEL CORPORATION, Tokyo (JP)

( * ) Notice: Subject to any disclaimer, the term of this patent is extended or adjusted under 35 U.S.C. 154(b) by 503 days.

(21) Appl. No.: 14/007,974

(22) PCT Filed: Mar. 26, 2012

(86) PCT No.: PCT/JP2012/058774
§ 371 (c)(1),
(2), (4) Date: Sep. 27, 2013

(87) PCT Pub. No.: WO2012/133867
PCT Pub. Date: Oct. 4, 2012

(65) Prior Publication Data
US 2014/0019071 A1    Jan. 16, 2014

(30) Foreign Application Priority Data

Mar. 30, 2011    (JP) .................................. 2011-075778

(51) Int. Cl.
*G06F 17/50* (2006.01)
*G01L 1/04* (2006.01)

(52) U.S. Cl.
CPC .............. *G01L 1/04* (2013.01); *G06F 17/5018* (2013.01); *G06F 17/5095* (2013.01); *Y02T 10/82* (2013.01)

(58) Field of Classification Search
CPC .................................................. G06F 17/5018
USPC .......................................................... 702/42
See application file for complete search history.

(56) References Cited

U.S. PATENT DOCUMENTS 7,957,918 B2 * 6/2011 Niwa ..................... B21D 22/02
                                                                702/33
8,589,132 B2    11/2013 Miyagi

FOREIGN PATENT DOCUMENTS

| JP | 2007-229724 | 9/2007 |
| JP | 2009-172677 | 8/2009 |
| WO | 2008/026777 | 3/2008 |

OTHER PUBLICATIONS

International Search Report—PCT/JP2012/058774—Jun. 19, 2012.
Sato, K., Hira, T., Yoshitake, A., Gerlach, J. et al.: "Springback Simulation for Automotive Body Components using HighStrength Steels". SAE International, Jan. 2003, URL: http://papers.sae.org/2003-01-2868/.
Kim, H et al.: "Numerical investigations on springback characteristics of aluminum sheet metal alloys in warm forming conditions." Journal of Materials Processing Technology, Elsevier, NL, vol. 204, No. 1-3, 370-383.
Meinders et al; "Numerical product design: Springback prediction, compensation and optimization", International Journal of Machine Tool Design and Research, Pergamon Press, Oxford, GB, vol. 48, No. 5, Feb. 6, 2008, pp. 499-514.

* cited by examiner

Primary Examiner — Bryan Bui
(74) Attorney, Agent, or Firm — Young & Thompson

(57) ABSTRACT

A method for press forming analysis includes (1) performing a coordinate transformation to calculate a distribution of stress (a) before a release from the press die in a local coordinate system; (2) performing a springback analysis which includes (i) calculating a distribution of residual stress after the release and performing the coordinate transformation to calculate a distribution of residual stress (b) in the local coordinate system, and (ii) calculating shape data (d) after the release; (3) calculating a difference (a-b) as SB effective stress, performing a coordinate transformation to calculate a distribution of SB effective stress in a global coordinate system, changing or removing the SB effective stress in an analysis target region and performing the springback analysis to calculate a shape data (c) after the release; and (4) calculating a difference (c-d) to determine a degree of influence of the analysis target region.

2 Claims, 4 Drawing Sheets

AFTER TRIMMING

BEND LINE

AFTER BENDING

PRODUCT SHAPE

ANOTHER VIEW OF THE ABOVE

FIXED POINT FOR SPRING BACK ANALYSIS

METHOD FOR PRESS FORMING ANALYSIS

TECHNICAL FIELD

This invention relates to a method for press forming analysis, and particularly to a method that quickly and accurately analyzes a degree of influence of stress in each region of a press-formed part on the springback.

BACKGROUND ART

To realize the weight saving of an automobile, application of high-strength steel sheets to automobile parts has been expanded in recent years. Since the degree of an elastic recovery (hereinafter referred to as a springback, or may be abbreviated as SB) of high strength steel sheets after a press forming is greater than that of mild steel sheets, it is difficult to ensure accuracy of dimensions of parts. Therefore, until an acceptable dimensional accuracy is achieved, a repeated correction of a shape of press die and springback compensation of die are required.

To reduce the burden for such correction of a press die, techniques for estimating the amount of springback at the press die design stage have been demanded, and analysis systems for the estimation have been developed.

The analysis method involves the following stages:

(1) analysis of the deformation, stress, and strain of a part under the restraint by a press die; and (2) analysis of the springback after the release from the restraint by the press die.

Note that the analysis in stage (1) is performed by using a finite element method, and the analysis in stage (2) is performed by using a springback theoretical formula or a finite element method.

The springback is known to be caused by an uneven distribution of residual stress accumulated in a formed part before the formed part is released from a press die. Conventionally, estimation using a numerical analysis method, such as a finite element method, has been performed. However, it has been difficult to estimate which region of the formed part has residual stress having a dominant influence on the springback.

For example, Patent Literatures 1 and 2 discuss influences of the shape and the forming conditions of a formed part on the springback.

Patent Literature 1 discloses a method of calculating how a value, which is defined to describe the springback, changes when a distribution of residual stress in a specific region of a press-formed part changes, and estimating an influence of the distribution of residual stress in the specific region on the springback.

CITATION LIST

Patent Literature

PTL 1: Japanese Unexamined Patent Application Publication No. 2007-229724

SUMMARY OF INVENTION

Technical Problem

The method of changing stress disclosed in Patent Literature 1 removes or changes the stress by only considering the stress before releasing the press-formed part from a press die. Then, a springback analysis is performed and compared with a case that the stress is not changed to examine an influence of the change of the stress.

However, even after a press-formed part is released from a press die, that is, even after the springback, the stress remains in the press-formed part. Therefore, when the influence is examined by only considering the stress before releasing the press-formed part from a press die, it may be difficult to accurately evaluate the influence of the stress in each region of the press-formed part.

This invention has been made to solve the problems described above. An object of this invention is to determine, by changing the stress before the release from a press die, a degree of influence of stress in each region of a press-formed part on the springback by considering a distribution of stress (residual stress) after releasing the press-formed part from a press die.

Solution to Problem

This invention is summarized as follows.

A first invention is a method for press forming analysis, including (1) calculating a data representing a shape of and a distribution of residual stress in a press-formed part before being released from a press die, and performing a coordinate transformation on a basis of the data before being released from the press die to calculate a distribution of stress (a) before being released from the press die in a local coordinate system;

(2) performing a springback analysis on a basis of the data before being released from the press die, wherein the performing of the springback analysis includes: (i) calculating a distribution of residual stress in the press-formed part after being released from the press die and performing the coordinate transformation to calculate a distribution of residual stress (b) in the press-formed part in the local coordinate system; and (ii) calculating a first shape data (d) of the press-formed part after being released from the press die;

(3) calculating a difference (a-b) between the distributions of stress (a) and (b) as a springback effective stress (SB effective stress), performing a coordinate transformation to calculate a distribution of SB effective stress in a global coordinate system, changing or removing the SB effective stress in an analysis target region in the distribution of SB effective stress to calculate a second distribution of SB effective stress in the press-formed part, and performing the springback analysis to calculate a second shape data (c) of the press-formed part after being released from the press die; and (4) calculating a difference (c-d) between the second shape data (c) and the first shape data (d) to determine a degree of influence of the analysis target region on the overall shape.

A second invention is a method for press forming analysis, including (1) calculating a data representing a shape of and a distribution of residual stress in a press-formed part before being released from a press die, and performing a coordinate transformation on a basis of the data before being released from the press die to calculate a distribution of stress (a) before being released from the press die in a local coordinate system;

(2) performing a springback analysis on a basis of the data before being released from the press die, wherein the performing of the springback analysis includes: (i) calculating a distribution of residual stress in the press-formed part after being released from the press die and performing the coordinate transformation to calculate a distribution of residual stress (b) in the press-formed part in the local coordinate system; and (ii) calculating a first shape data (d) of the press-formed part after being released from the press die;

(3) calculating a difference (a-b) between the distributions of stress (a) and (b) as a springback effective stress (SB effective stress), performing a coordinate transformation to calculate a distribution of SB effective stress in a global coordinate system, removing the SB effective stress in an analysis target region in the distribution of SB effective stress to calculate a second distribution of SB effective stress (X) in the press-formed part;

(4) assigning the distribution of residual stress (b) in the local coordinate system to the shape of the press-formed part before being released from the press die to calculate an equivalent of residual stress in the local coordinate system, and performing the coordinate transformation to calculate an equivalent of residual stress (Y) in the press-formed part in the global coordinate system;

(5) adding the equivalent of residual stress (Y) in the press-formed part to the second distribution of SB effective stress (X) in the press-formed part to calculate a second distribution of stress, performing the springback analysis to calculate a third shape data (c) of the press-formed part after being released from the press die; and (6) calculating a difference (c-d) between the third shape data (c) and the first shape data (d) to determine a degree of influence of the analysis target region on the overall shape.

Advantageous Effects of Invention

It is possible to appropriately evaluate an influence of the stress in an analysis target region on the springback without overestimating or underestimating the stress that actually contributes to the springback. By setting a local coordinate system, it is possible to evaluate an influence of a specific component of the stress by only removing the component. The analysis can be used to examine measures to reduce the springback.

DESCRIPTION OF EMBODIMENTS (First Embodiment)

A first embodiment of this invention will be described with reference to a drawing.

Figure 4:
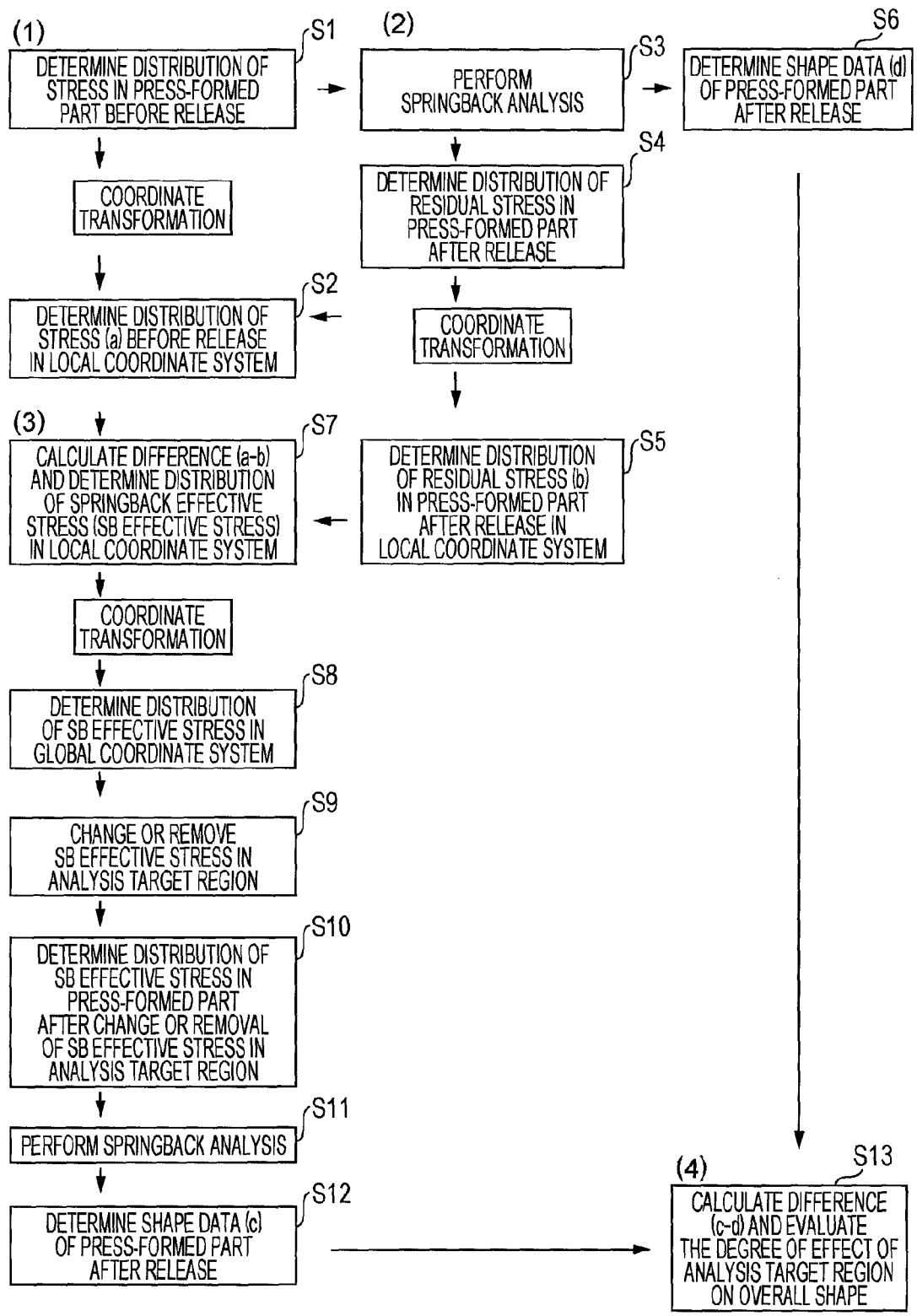
FIG. 4 is a flowchart of a first embodiment.

FIG. 4 is a flowchart illustrating a procedure of a method for press forming analysis according to the first embodiment of a method for press forming analysis of this invention. The first embodiment is an analysis method that focuses only on a springback effective stress. That is, the first embodiment changes or removes the springback effective stress in a springback analysis target region, performs a springback analysis, and makes a comparison with a shape of the press-formed part after the release. Thus, an influence of stress in the springback analysis target region is evaluated.

An analytical calculation in the method for press forming analysis illustrated in FIG. 4 is performed by using a finite element method (FEM) analysis system.

(1)

S1: First, in step S1, a distribution of stress in a press-formed part before the release from a press die is determined.

S2: In step S2, the stress determined in step S1, which is expressed in the global coordinate system, is subjected to a coordinate transformation, and a distribution of stress (a) in a local coordinate system is determined. A springback causes a turning of the press-formed part after the release. Therefore, if a difference in the stress is determined by directly subtracting the stresses expressed in the global coordinate system, it is not possible to accurately determine the stress that contributes to the deformation. Thus, for respective finite elements to which the distribution of stress is given, a local coordinate system that does not change after the release is defined and the stress is subjected to a coordinate transformation. Then, a difference in the stress before and after the release is determined. This is a technique typically used in finite element analysis.

The coordinate transformation of the stress is given by the following equations (1):

[Numerical Expression 1]

$$\underbrace{\begin{pmatrix} \sigma_x & \tau_{xy} & \tau_{xz} \\ \tau_{xy} & \sigma_y & \tau_{yz} \\ \tau_{xz} & \tau_{yz} & \sigma_z \end{pmatrix}}_{\text{STRESS EXPRESSION IN LOCAL COORDINATE SYSTEM } xyz} = \begin{pmatrix} l_1 & l_2 & l_3 \\ m_1 & m_2 & m_3 \\ n_1 & n_2 & n_3 \end{pmatrix}^T \underbrace{\begin{pmatrix} \sigma_X & \tau_{XY} & \tau_{XZ} \\ \tau_{XY} & \sigma_Y & \tau_{YZ} \\ \tau_{XZ} & \tau_{YZ} & \sigma_Z \end{pmatrix}}_{\text{STRESS EXPRESSION IN GLOBAL COORDINATE SYSTEM } XYZ} \begin{pmatrix} l_1 & l_2 & l_3 \\ m_1 & m_2 & m_3 \\ n_1 & n_2 & n_3 \end{pmatrix} \quad (1)$$

$$\underbrace{\begin{pmatrix} \sigma_X & \tau_{XY} & \tau_{XZ} \\ \tau_{XY} & \sigma_Y & \tau_{YZ} \\ \tau_{XZ} & \tau_{YZ} & \sigma_Z \end{pmatrix}}_{\text{STRESS EXPRESSION IN GLOBAL COORDINATE SYSTEM } XYZ} = \begin{pmatrix} l_1 & l_2 & l_3 \\ m_1 & m_2 & m_3 \\ n_1 & n_2 & n_3 \end{pmatrix} \underbrace{\begin{pmatrix} \sigma_x & \tau_{xy} & \tau_{xz} \\ \tau_{xy} & \sigma_y & \tau_{yz} \\ \tau_{xz} & \tau_{yz} & \sigma_z \end{pmatrix}}_{\text{STRESS EXPRESSION IN LOCAL COORDINATE SYSTEM } xyz} \begin{pmatrix} l_1 & l_2 & l_3 \\ m_1 & m_2 & m_3 \\ n_1 & n_2 & n_3 \end{pmatrix}^T$$

where $(l_1, m_1, n_1)$, $(l_2, m_2, n_2)$, and $(l_3, m_3, n_3)$ are unit vectors of three orthogonal axes in the local coordinate system.

In a press forming simulation, the local coordinate system is defined typically by using a shell element having four or three nodes and no node in the thickness direction. Therefore, it is common to select, as the third axis of the coordinate system, the thickness direction, that is, the direction normal to a plane defined by four or three nodes.

In the case of a four-node shell element, the four nodes are not necessarily in the same plane. Therefore, for example, (1) a direction obtained from an outer product of the diagonal lines may be defined as the thickness direction, or (2) a direction normal to an approximate plane may be defined as the thickness direction. As for the first axis and the second axis, for example, (1) a direction from the first node to the second node of the shell element may be defined as the first axis, or (2) the first axis and the second axis may be created from vectors of the diagonal lines.

(2)

S3: A Springback analysis is performed on the basis of the distribution of stress determined in step S1.

S4: A distribution of residual stress in the press-formed part after the release is determined.

S5: A coordinate transformation from the global coordinate system to the local coordinate system is performed, and a distribution of residual stress (b) in the press-formed part after the release in the local coordinate system is determined.

S6: Shape data (d) of the press-formed part after the release is determined from the springback analysis performed in step S3.

(3)

S7: A difference (a-b) between the distribution of stress (a) before the release and the distribution of residual stress (b) after the release, which is defined as a springback effective stress (hereinafter referred to as SB effective stress), is determined.

S8: A coordinate transformation from the local coordinate system to the global coordinate system is performed, and a distribution of SB effective stress in the global coordinate system is determined.

S9: SB effective stress in an analysis target region is changed or removed.

S10: A distribution of SB effective stress in the press-formed part after the change or removal of the SB effective stress in the analysis target region is determined.

S11: A springback analysis is performed on the basis of the distribution of stress determined in step S10.

S12: Shape data (c) of the press-formed part after the release is determined.

(4)

S13: A difference (c-d) between the shape data (c) and the shape data (d) is calculated, and a degree of influence of the SB analysis target region on the overall shape is evaluated.

(Second Embodiment)

A second embodiment of this invention will be described with reference to a drawing.

Figure 5:
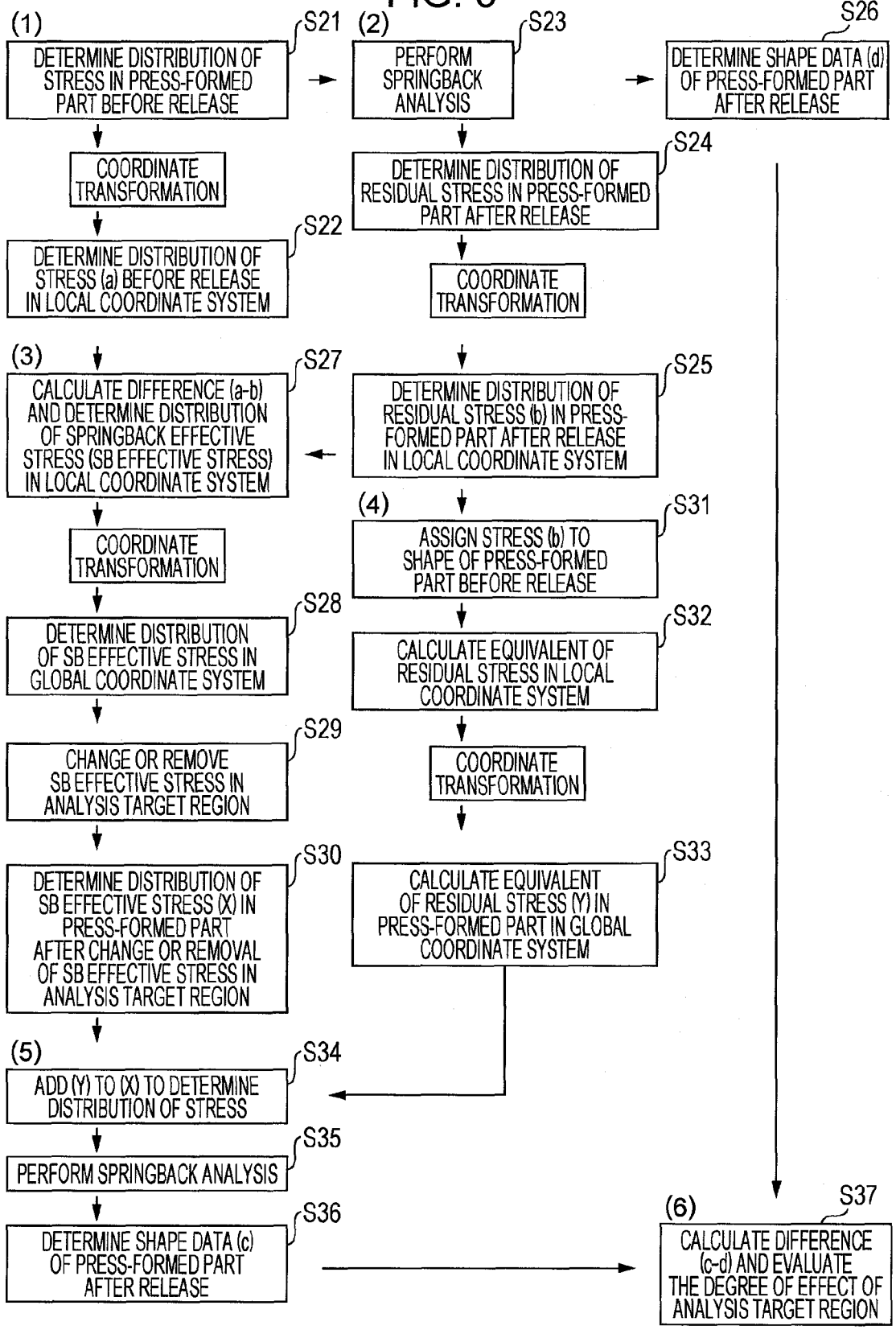
FIG. 5 is a flowchart of a second embodiment.

FIG. 5 is a flowchart illustrating a procedure of a method for press forming analysis according to the second embodiment of the method for press forming analysis of this invention.

The second embodiment is an analysis method that adds the residual stress in the local coordinate system to the distribution of the springback effective stress in the local coordinate system determined by the partial change or removal of the springback effective stress determined in the first embodiment, and transforms the obtained distribution of stress into the global coordinate system. Then, performs a springback analysis, and makes a comparison with a shape of the press-formed part after the release. Thus, an influence of stress in the springback analysis target region is evaluated.

An analytical calculation in the method for press forming analysis illustrated in FIG. 5 is performed by using a finite element method (FEM) analysis system.

(1)

S21: First, in step S21, a distribution of stress in a press-formed part before the release is determined.

S22: In step S22, a local coordinate system that does not change after the release is defined. Then, the stress determined in step S21, which is expressed in the global coordinate system, is subjected to a coordinate transformation, and a distribution of stress (a) in the local coordinate system is determined. The method for determining the local coordinate system is the same as that in the first embodiment and thus is not described here.

(2)

S23: A Springback analysis is performed on the basis of the distribution of stress determined in step S21.

S24: A distribution of residual stress in the press-formed part after the release is determined.

S25: A coordinate transformation from the global coordinate system to the local coordinate system is performed, and a distribution of residual stress (b) in the press-formed part after the release in the local coordinate system is determined.

S26: Shape data (d) of the press-formed part after the release is determined from the springback analysis performed in step S23.

(3)

S27: A difference (a-b) between the distribution of stress (a) before the release and the distribution of residual stress (b) after the release, which is defined as the springback effective stress (hereinafter referred to as SB effective stress), is determined.

S28: A coordinate transformation from the local coordinate system to the global coordinate system is performed, and a distribution of SB effective stress in the global coordinate system is determined.

S29: SB effective stress in an analysis target region is changed or removed.

S30: A distribution of SB effective stress (X) in the press-formed part after the change or removal of the SB effective stress in the analysis target region is determined.

(4)

S31: The stress (b) is assigned to the shape of the press-formed part before the release.

S32: An equivalent of residual stress in the local coordinate system is determined.

S33: The transformation to the global coordinate system is performed, and an equivalent of residual stress (Y) in the press-formed part in the global coordinate system is determined.

(5)

S34: The equivalent of residual stress (Y) is added to the distribution of SB effective stress (X) to calculate a distribution of stress.

S35: A Springback analysis is performed.

S36: Shape data (c) of the press-formed part after the release is determined.

(6)

S37: A difference (c-d) between the shape data (c) and the shape data (d) is calculated, and a degree of influence of the SB analysis target region on the overall shape is evaluated.

EXAMPLE 1

As an example of the method for press forming analysis according to this invention, press forming of a front body inner pillar part will be described.

Figure 1:
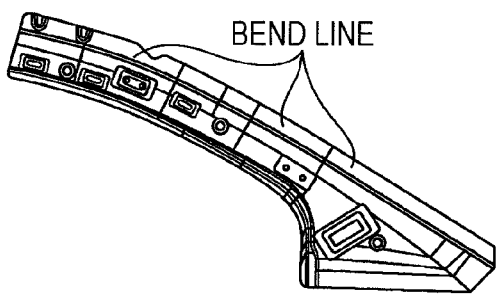
FIG. 1 is a general view of a front body inner pillar subjected to SB analysis.
Figure 1:
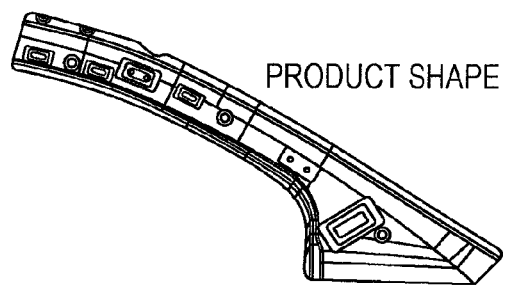
Figure 1:
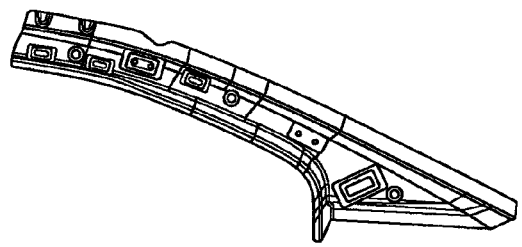

FIG. 1 illustrates a general shape of the part. A 980 MPa grade high-strength cold-rolled steel sheet with a thickness of 1.6 mm is press-formed using a die and trimmed. And the press-formed part is subjected to bending, and shaped into the front body inner pillar part. In the process of bending, the steel sheet is bent along bend lines illustrated in FIG. 1.

Figure 2:
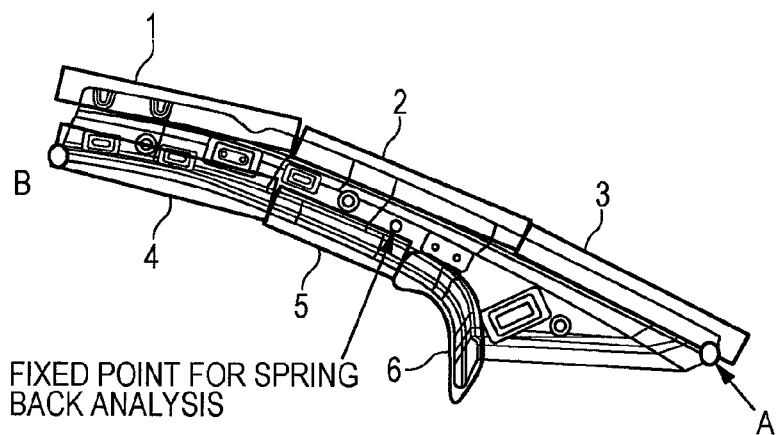
FIG. 2 illustrates SB analysis target regions of the front body inner pillar.
Figure 2:
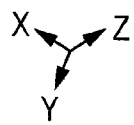

The press forming analysis analyzed a degree of influence of stress in each of the analysis target regions 1 to 6 illustrated in FIG. 2 on the forming of the front body inner pillar part illustrated in FIG. 1.

The analysis was performed by using a commercially available finite element method (FEM) analysis system in accordance with the steps illustrated in FIGS. 4 and 5. Specifically, after the process of bending, the stress in each of the regions (1 to 6) illustrated in FIG. 2 was removed, and influences on displacements in the Z direction at points A and B was examined. Normally (i.e., when the stress in each region is not removed), displacements in the Z direction after the springback analysis is −16.5 mm at point A and −9.7 mm at point B, respectively. Conventional Example (Patent Literature 1) removed the entire stress in each analysis target region (one of 1 to 6) and performed the springback calculation. Inventive Example 1 extracted only SB effective stress according to this invention (in step S8 of FIG. 4), removed SB effective stress in each analysis target region (one of 1 to 6) (in step S9 of FIG. 4), and performed the springback calculation (in step S11 of FIG. 4). Inventive Example 2 removed SB effective stress in each analysis target region (one of 1 to 6) (in step S29 of FIG. 5), and performed the springback calculation (in step S35 of FIG. 5).

Figure 3:
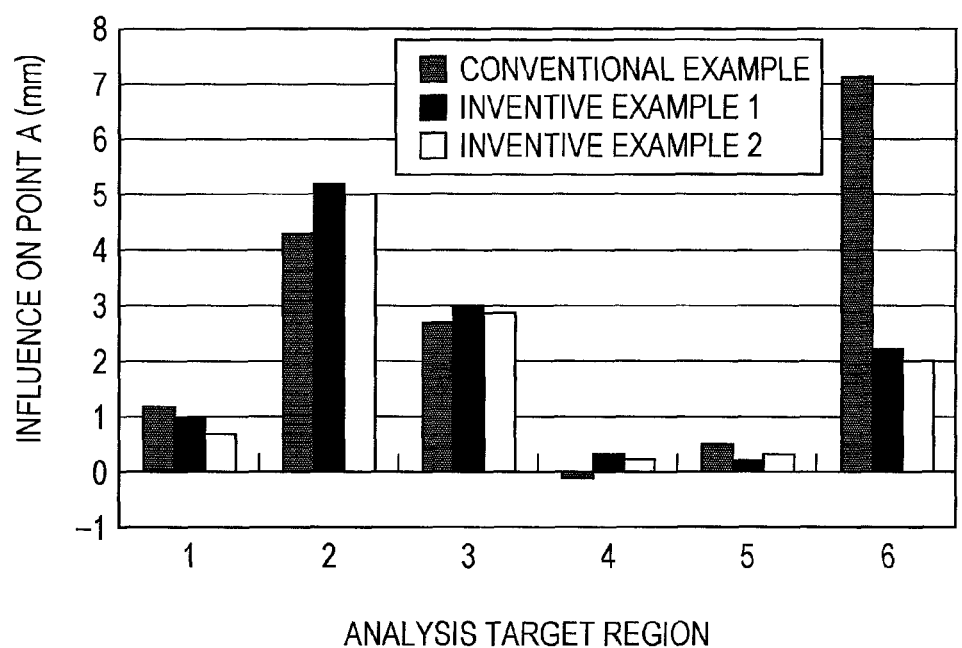
FIG. 3 illustrates an analysis result.

The results are shown in FIG. 3. The horizontal axis represents the number that denotes the analysis target regions, and the vertical axis represents the displacement (mm) in the Z direction at point A. As shown, the analysis target region 6 has the largest influence in Conventional Example, whereas the analysis target region 2 has the largest influence in Inventive Examples 1 and 2.

To specifically verify the results of factor analysis, each of the analysis target regions 2 and 6 was notched in a triangular shape at the flange, and a comparison was made. With a notch, since a deformation around the notch does not affect the other portions, it is possible to realize an effect similar to that in the case where the stress is removed.

When the analysis target region 6 was notched, point A was raised by 1.2 mm, whereas when the analysis target region 2 was notched, point A was raised by 4.3 mm. This shows that the analysis target region 2 has a larger influence, and that the factor analyses performed in Inventive Examples 1 and 2 are better than that performed in Conventional Example.

As described above, the analysis target region 6 has the largest influence in Conventional Example. It seems that, since the analysis target region 6 has a relatively complex shape and has a large residual stress after the springback, removing the residual stress at this analysis target region has a noticeable influence. Also, in the bending process, since the analysis target regions 4 to 6 are farther from the bend lines to which plastic deformation is applied, it seems that the influence of the analysis target region 6 is overestimated in Conventional Example.

REFERENCE SIGNS LIST 1 to 6: reference numerals denoting analysis target regions

The invention claimed is:

1. A method for press forming analysis, comprising the steps of:
   (1) calculating a data representing a shape of and a distribution of stress in a press-formed part before being released from a press die in a global coordinate system, and performing a coordinate transformation on a basis of the data before being released from the press die to calculate a distribution of stress (a) before being released from the press die in a local coordinate system;
   (2) performing a springback analysis on a basis of the data before being released from the press die, wherein the performing of the springback analysis includes:
      (i) calculating a distribution of residual stress in the press-formed part after being released from the press die and performing the coordinate transformation to calculate a distribution of residual stress (b) in the press-formed part in the local coordinate system; and
      (ii) calculating a first shape data (d) of the press-formed part after being released from the press die;
   (3) calculating a difference (a-b) between the distributions of stress (a) and (b) as a springback effective stress (SB effective stress), performing a reverse coordinate transformation to calculate a distribution of SB effective stress in the global coordinate system, changing or removing the SB effective stress in an analysis target region in the distribution of SB effective stress to calculate a second distribution of SB effective stress in the press-formed part, and performing the springback analysis on a basis of the second distribution of SB effective stress to calculate a second shape data (c) of the press-formed part after being released from the press die; and
   (4) calculating a difference (c-d) between the second shape data (c) and the first shape data (d) to determine a degree of influence of the analysis target region on the overall shape.

2. A method for press forming analysis, comprising the steps of:
   (1) calculating a data representing a shape of and a distribution of stress in a press-formed part before being released from a press die in the global coordinate system, and performing a coordinate transformation on a basis of the data before being released from the press die to calculate a distribution of stress (a) before being released from the press die in a local coordinate system;
   (2) performing a springback analysis on a basis of the data before being released from the press die, wherein the performing of the springback analysis includes:
      (i) calculating a distribution of residual stress in the press-formed part after being released from the press die and performing the coordinate transformation to calculate a distribution of residual stress (b) in the press-formed part in the local coordinate system; and
      (ii) calculating a first shape data (d) of the press-formed part after being released from the press die;
   (3) calculating a difference (a-b) between the distributions of stress (a) and (b) as a springback effective stress (SB effective stress), performing a reverse coordinate transformation to calculate a distribution of SB effective stress in the global coordinate system, changing or removing the SB effective stress in an analysis target region in the distribution of SB effective stress to calculate a second distribution of SB effective stress (X) in the press-formed part;
(4) assigning the distribution of residual stress (b) in the local coordinate system to the shape of the press-formed part before being released from the press die to calculate an equivalent of residual stress in the local coordinate system, and performing the reverse coordinate transformation to calculate an equivalent of residual stress (Y) in the press-formed part in the global coordinate system;
(5) adding the equivalent of residual stress (Y) in the press-formed part to the second distribution of SB effective stress (X) in the press-formed part to calculate a second distribution of stress, performing the springback analysis on a basis of the second distribution of stress to calculate a third shape data (c) of the press-formed part after being released from the press die; and
(6) calculating a difference (c-d) between the third shape data (c) and the first shape data (d) to determine a degree of influence of the analysis target region on the overall shape.

* * * * *